United States Patent
Meng et al.

(10) Patent No.: US 10,367,120 B2
(45) Date of Patent: Jul. 30, 2019

(54) LIGHT EMITTING DIODE AND FABRICATION METHOD THEREOF

(71) Applicant: XIAMEN SAN'AN OPTOELECTRONICS CO., LTD., Xiamen (CN)

(72) Inventors: Cheng Meng, Xiamen (CN); Yian Lu, Xiamen (CN); Chun-Yi Wu, Xiamen (CN); Duxiang Wang, Xiamen (CN)

(73) Assignee: XIAMEN SAN'AN OPTOELECTRONICS CO., LTD., Xiamen (CN)

(*) Notice: Subject to any disclaimer, the term of this patent is extended or adjusted under 35 U.S.C. 154(b) by 0 days.

(21) Appl. No.: 16/186,538

(22) Filed: Nov. 10, 2018

(65) Prior Publication Data

US 2019/0081214 A1 Mar. 14, 2019

Related U.S. Application Data

(63) Continuation-in-part of application No. 15/871,289, filed on Jan. 15, 2018, now Pat. No. 10,158,045, (Continued)

(30) Foreign Application Priority Data

Jun. 13, 2016 (CN) .......................... 2016 1 0413139

(51) Int. Cl.
| | | |
|---|---|---|
| *H01L 33/38* | (2010.01) | |
| *H01L 33/44* | (2010.01) | |
| *H01L 33/40* | (2010.01) | |
| *H01L 33/14* | (2010.01) | |
| *H01L 33/32* | (2010.01) | |
| *H01L 33/46* | (2010.01) | |
| *H01L 33/30* | (2010.01) | |
| *H01L 33/00* | (2010.01) | |

(52) U.S. Cl.
CPC ............ *H01L 33/44* (2013.01); *H01L 33/387* (2013.01); *H01L 33/0079* (2013.01); *H01L 33/14* (2013.01); *H01L 33/30* (2013.01); *H01L 33/32* (2013.01); *H01L 33/405* (2013.01); *H01L 33/46* (2013.01); *H01L 2933/0016* (2013.01); *H01L 2933/0025* (2013.01)

(58) Field of Classification Search
CPC ....... H01L 33/387; H01L 33/16; H01L 33/22; H01L 33/0095; H01L 33/0079; H01L 33/44; H01L 33/0075; H01L 33/10; H01L 33/38; H01L 33/14; H01L 33/405; H01L 33/46; H01L 33/32; H01L 33/30
See application file for complete search history.

(56) References Cited

U.S. PATENT DOCUMENTS 8,368,102 B2 * 2/2013 Fujimoto ................ H01L 33/20
257/98

* cited by examiner

*Primary Examiner* — David Vu
(74) *Attorney, Agent, or Firm* — Syncoda LLC; Feng Ma

(57) ABSTRACT

A light-emitting diode includes a light-emitting epitaxial laminated layer with an upper surface; an ohmic contact layer over the light-emitting epitaxial laminated layer; an expanding electrode over the ohmic contact layer; a transparent insulating layer that covers the expanding electrode and the exposed ohmic contact layer, having a hole through the transparent insulating layer in a position corresponding to the expanding electrode; and a welding wire electrode over the transparent insulating layer and coupled to the expanding electrode via the hole.

20 Claims, 7 Drawing Sheets

Related U.S. Application Data which is a continuation of application No. PCT/CN2017/085660, filed on May 24, 2017.

ably made from conductive materials, such as Si, SiC, GaAs, Cu, Mo or MoW. In some embodiments, the thickness of the conductive substrate 200 is 50~300 μm.

LIGHT EMITTING DIODE AND FABRICATION METHOD THEREOF

CROSS-REFERENCE TO RELATED APPLICATIONS

The present application is a continuation-in-part of, and claims priority to, U.S. patent application Ser. No. 15/871,289 filed on Jan. 15, 2018, which is a continuation of, and claims priority to, PCT/CN2017/085660 filed on May 24, 2017, which claims priority to Chinese Patent Application No. 201610413139.8 filed on Jun. 13, 2016. The disclosures of these applications are hereby incorporated by reference in their entirety.

BACKGROUND

In recent years, light-emitting diode (LED) is widely applied and plays an increasingly important role in various fields like display system, lighting system and automobile tail light.

SUMMARY

The inventors of the present disclosure have recognized that, in the existing big-power light-emitting diode, light is emitted from the lower part of the welding wire electrode. Therefore, the existing big-power light-emitting diode suffers low light extracting rate due to light absorption by electrodes.

FIG. 1 shows an existing big-power light-emitting diode structure where light is emitted from the P-side, wherein, a light-emitting epitaxial laminated layer 150 is bonded to the conductive substrate 100 via a metal bonding layer 110; an ohmic contact layer 160 is fabricated over the upper surface of the light-emitting laminated layer 150, and a first welding wire electrode 171 and a second welding wire electrode 172 are formed over the ohmic contact layer 160. Though meeting big power needs, this structure itself is of great waste. Referring to FIG. 2, the second welding wire electrode (wiring electrode) in the design is large. When current is connected, a high proportion of current is input to the active layer under the first welding wire electrode for recombination luminescence. A large majority of emitted light is absorbed or blocked by the first welding wire electrode, and cannot be emitted from the epitaxial surface, causing great waste of current. In addition, light emitted from the light-emitting region to the lower part of the second welding wire electrode is also absorbed and blocked, which greatly influences light extraction rate of LED.

To solve the above problems, the present disclosure provides a light-emitting diode and fabrication thereof, where, no light is emitted from the lower part of the welding wire electrode. This structure is designed with a patterned ohmic contact layer. With a combination of a transparent insulating layer, an expanding electrode and a welding wire electrode, the lower part of the welding wire electrode has no ohmic contact and is far from the ohmic contact layer as much as possible.

The technical scheme of the present disclosure to solve the above problems is: a light-emitting diode, which includes: a light-emitting epitaxial laminated layer, including a first semiconductor layer, an active layer and a second semiconductor layer, wherein, the upper surface is divided into an ohmic contact region and a non-ohmic contact region; an ohmic contact layer in the ohmic contact region of the light-emitting epitaxial laminated layer; an expanding electrode over the ohmic contact layer, at least a part of which extends towards the edge of the ohmic contact layer to the non-ohmic contact region of the light-emitting epitaxial laminated layer, and contacts with the upper surface of the light-emitting epitaxial laminated layer; a transparent insulating layer that covers the expanding electrode, the exposed ohmic contact layer and the upper surface of the light-emitting epitaxial laminated layer; a current channel that is in and runs through the transparent insulating layer, and connects to the expanding electrode, wherein, the projection on the light-emitting epitaxial laminated layer is in the non-ohmic contact region; a welding wire electrode over the transparent insulating layer, which connects to the expanding electrode via a current channel, wherein, the projection on the light-emitting epitaxial laminated layer is in the non-ohmic contact region; when current is input, current quickly flows to the ohmic contact region of the light-emitting epitaxial laminated layer along the current channel under the welding wire electrode, so that no current is input to the active layer under the welding wire electrode for lighting.

In some embodiments, the lower part of the welding wire electrode and nearby regions have no ohmic contact layer.

In some embodiments, the non-ohmic contact region over the upper surface of the light-emitting epitaxial laminated layer is larger than the welding wire electrode.

In some embodiments, the current channel is distal from the ohmic contact layer as much as possible.

In some embodiments, the non-ohmic contact region is distributed at both ends of the upper surface of the light-emitting epitaxial laminated layer, and the expanding electrode is a series of parallel linear structure, in which, the first and last ends are in the non-ohmic contact region, and the mid part contacts with the ohmic contact layer.

In some embodiments, refractive index of the transparent insulating layer is between that of the light-emitting epitaxial laminated layer and air.

In some embodiments, the transparent insulating layer, the light-emitting epitaxial laminated layer, and the welding wire electrode form an omnidirectional reflection system to avoid light absorption by the welding wire electrode.

In some embodiments, the lower surface of the light-emitting epitaxial laminated layer is provided with a reflector.

The present disclosure also provides a fabrication method of the light-emitting diode, including: 1) forming a light-emitting epitaxial laminated layer and an ohmic contact layer, wherein, the light-emitting epitaxial laminated layer includes a first semiconductor layer, an active layer and a second semiconductor layer; 2) defining an ohmic contact region and a non-ohmic contact region over the ohmic contact layer surface, and removing the ohmic contact layer in the non-ohmic contact region to expose the light-emitting epitaxial laminated layer; 3) forming an expanding electrode over the ohmic contact layer, a least a part of which extends towards the edge of the ohmic contact layer to the non-ohmic contact region of the upper surface of the light-emitting epitaxial laminated layer, and directly contacts with the exposed light-emitting epitaxial laminated layer; 4) forming a transparent insulating layer that covers the expanding electrode, the exposed ohmic contact layer and the upper surface of the light-emitting epitaxial laminated layer; 5) forming a current channel over the formed transparent insulating layer, which connects to the expanding electrode, wherein, the projection on the light-emitting epitaxial laminated layer is in the non-ohmic contact region; and 6) forming a welding wire electrode over the transparent insulating layer, which connects to the expanding electrode via the current channel, wherein, the projection on the light-emitting epitaxial laminated layer is in the non-ohmic contact region; when current is input, current quickly flows to the ohmic contact region of the light-emitting epitaxial laminated layer along the current channel at the lower portion of the welding wire electrode, so that no current is input to the active layer under the welding wire electrode for lighting.

The present disclosure also provides another fabrication method of light-emitting diode, including: 1) forming a light-emitting epitaxial laminated layer over the growth substrate, including a first semiconductor layer, an active layer and a second semiconductor layer having a first surface and a second surface opposite to each other, wherein, the first surface is far from the growth substrate, and is divided in to an ohmic contact region and a non-ohmic contact region; 2) forming an ohmic contact layer in the ohmic contact region of the first surface of the light-emitting epitaxial laminated layer; 3) fabricating an expanding electrode over the ohmic contact layer, a least a part of which extends towards the edge of the ohmic contact layer to the non-ohmic contact region of the light-emitting epitaxial laminated layer, and contacts with the light-emitting epitaxial laminated layer; 4) providing a temporary substrate, and binding it to the first surface of the light-emitting epitaxial laminated layer; 5) removing the growth substrate to expose the second surface of the light-emitting epitaxial laminated layer; 6) forming a reflector over the second surface of exposed light-emitting epitaxial laminated layer; 7) providing a conductive substrate, and binding it to the reflector; 8) removing the temporary substrate to expose the expanding electrode, a part of the light-emitting epitaxial laminated layer surface and the ohmic contact layer; 9) forming a transparent insulating layer, which covers the expanding electrode, the exposed ohmic contact layer and the first surface of the light-emitting epitaxial laminated layer; 10) setting a current channel over the formed transparent insulating layer, which connects to the expanding electrode, wherein, the projection on the light-emitting epitaxial laminated layer is in the non-ohmic contact region; and 11) forming a welding wire electrode over the transparent insulating layer, which connects to the expanding electrode via the current channel, wherein, the projection on the light-emitting epitaxial laminated layer is in the non-ohmic contact region.

In another aspect, a light-emitting system is provided including a plurality of light-emitting diodes described above. The light-emitting system can be used in the applications of lighting, display, signage, etc.

The other features and advantages of various embodiments of the present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
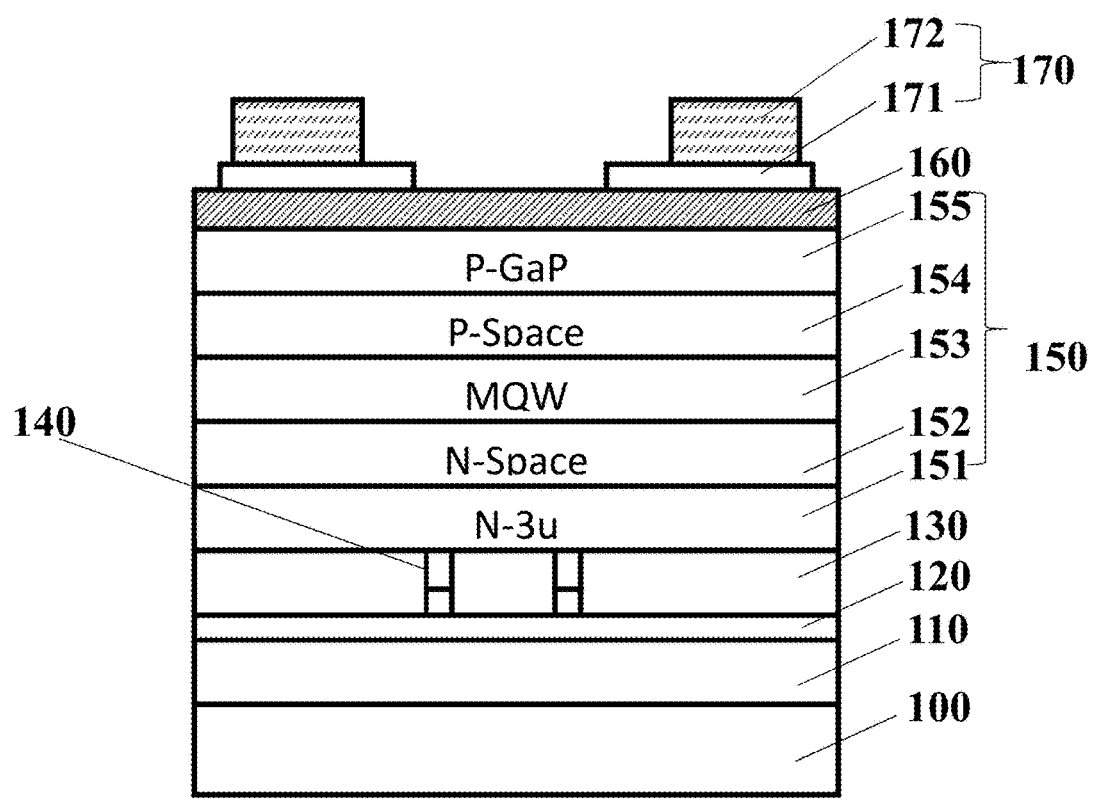
FIG. 1 illustrates a side sectional view of an existing big-power light-emitting diode where light is emitted from the P-side.
Figure 2:
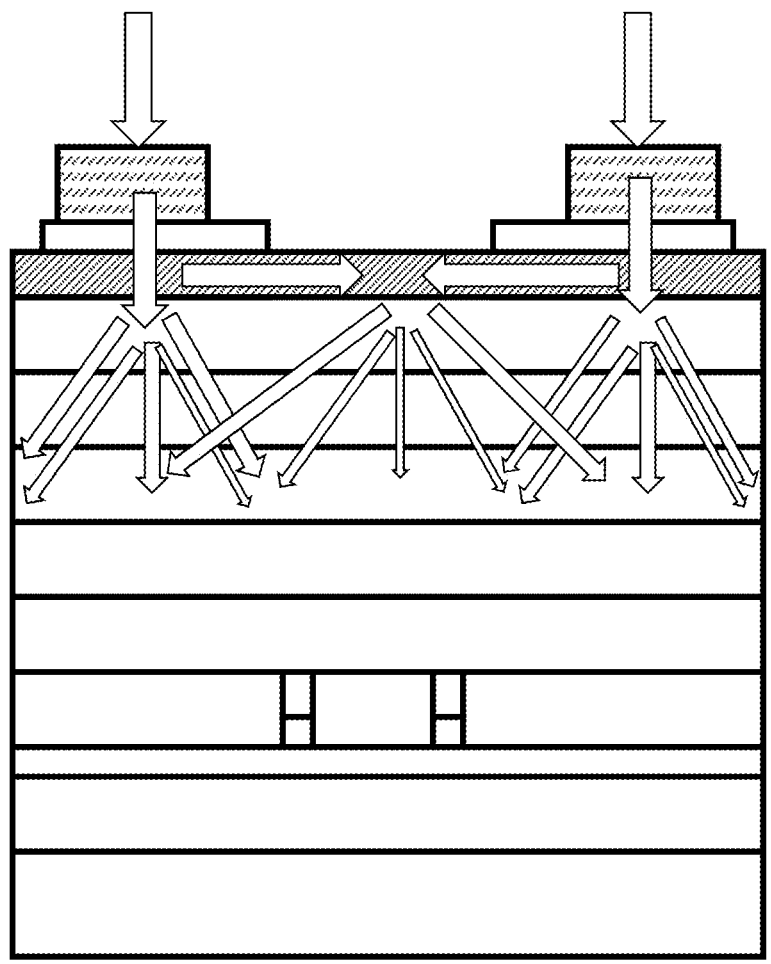
FIG. 2 shows a current flow diagram of the light-emitting diode as shown in FIG. 1.

In the drawing: 100, 200: conductive substrate; 110, 210: metal bonding layer; 120, 220: conductive reflective layer; 130, 230: medium layer; 140, 240: N-type ohmic contact layer; 150, 250: light-emitting epitaxial laminated layer; 151, 251: N-type current spreading layer; 152, 252: N-type cladding layer; 153, 253: active layer; 154, 254: P-type cladding layer; 155, 255: P-type window layer; 160, 260: P-type ohmic contact layer; 170, 270: top electrode; 171: first welding wire electrode; 172: second welding wire electrode; 250*a*: ohmic contact region; 250*b*: non-ohmic contact layer; 271: expanding electrode; 272: welding wire electrode; 273: current channel; 280: transparent insulating layer.

DETAILED DESCRIPTION

Various embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

Figure 3:
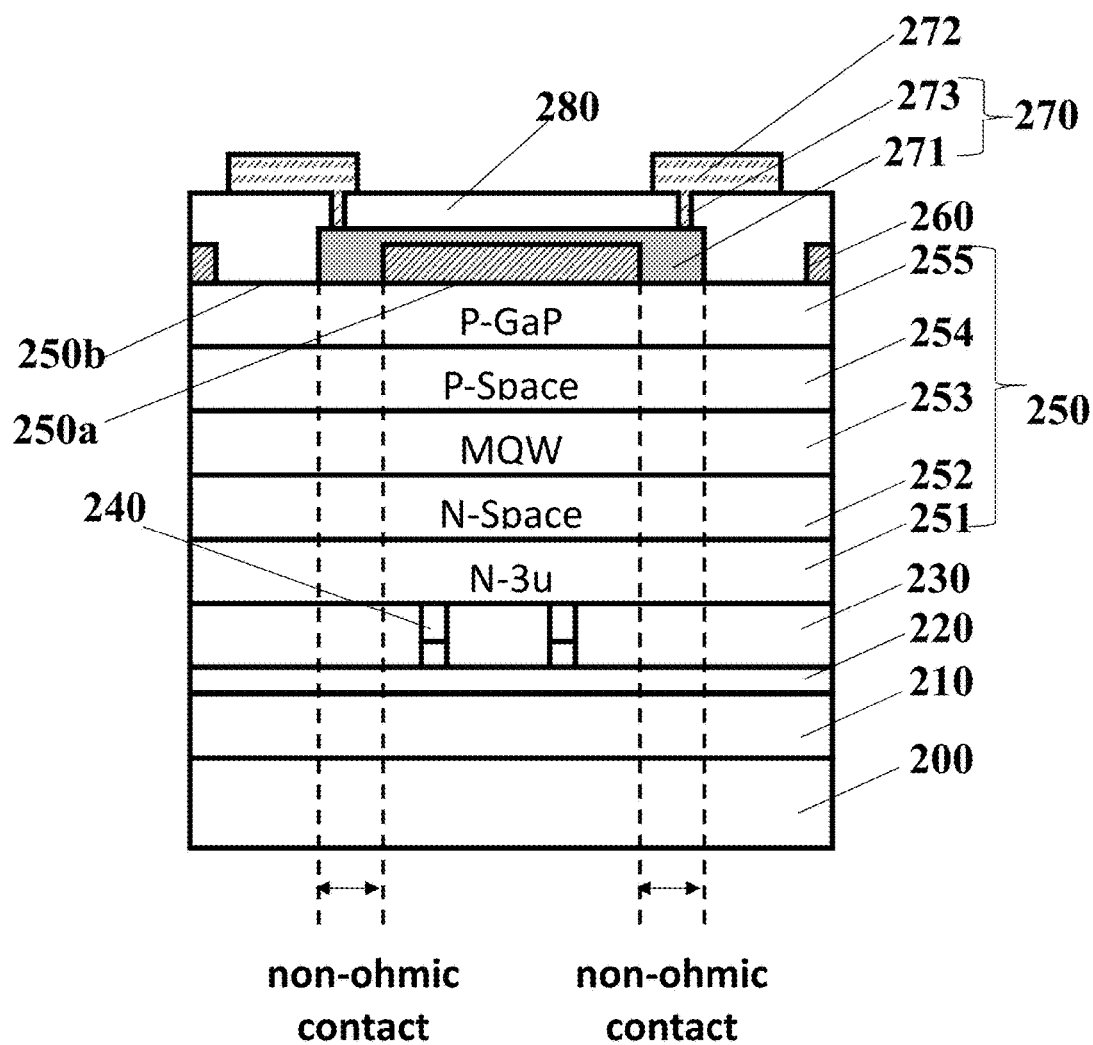
FIG. 3 illustrates a side sectional view of a big-power light-emitting diode where light is emitted from the P-side according to some embodiments of the present disclosure.

With reference to FIG. 3, a light-emitting diode of the present disclosure includes: a conductive substrate 200, a metal bonding layer 210, a conductive reflective layer 220, a transparent dielectric layer 230, a light-emitting epitaxial laminated layer 250, an ohmic contact layer 260, an expanding electrode 271, a transparent insulating layer 280 and a welding wire electrode 272, wherein, the conductive substrate 200 can be Si substrate; the transparent dielectric layer 230 is provided with a series of N-type contact layer points 231; the transparent dielectric layer 230 and the conductive reflective layer 220 form an omnidirectional mirror system; the upper surface of the light-emitting epitaxial laminated layer 250 is divided into an ohmic contact region 250*a* and a non-ohmic contact region 250*b*; an ohmic contact layer 260 is formed in the ohmic contact region 250*a* of the light-emitting epitaxial laminated layer 250, and the expanding electrode 271 is formed over the ohmic contact layer 260, a part of which extends towards the edge of the ohmic contact layer to the non-ohmic contact region 250*b* of the light-emitting epitaxial laminated layer, and contacts with the upper surface 250*b* of the light-emitting epitaxial laminated layer; the transparent insulating layer 280 covers the expanding electrode 271, the exposed ohmic contact layer 260 and the upper surface 250b of the light-emitting epitaxial laminated layer; the current channel 273 is in and runs through the transparent insulating layer 280, and connects to the expanding electrode 271, wherein, the projection on the light-emitting epitaxial laminated layer is in the non-ohmic contact region 250b; the welding wire electrode 272 is over the transparent insulating layer 280, which connects to the expanding electrode 271 via the current channel 273, the projection of which on the light-emitting epitaxial laminated layer is in the non-ohmic contact region 250b.

Details will be given below for the above light-emitting diode in combination with the fabrication method. The fabrication method mainly includes growth of the epitaxial laminated layer, patterning of the ohmic contact layer, fabrication of the expanding electrode, twice substrate transfer and fabrication of the insulating layer and the welding wire electrode.

I. Fabricate the Epitaxial Laminated Layer.

Form a light-emitting epitaxial laminated layer 250 over the growth substrate. The substrate can be sapphire, AlN, GaN, Si, SiC, GaAs and other materials, and the surface structure can be a plane structure or a patterned structure. When applied current flows through the light-emitting epitaxial laminated layer, the active layer is triggered to emit light. When the active layer is made of nitride-based material, blue or green light will be emitted; when made of AlInGaP-based material, red, orange or yellow light in amber color will be emitted. In another embodiment, the active layer is AlInGaP-based material. Therefore, the ohmic contact layer 260 is semiconductor material, which is formed with the light-emitting epitaxial laminated layer via epitaxial growth. Details are as follows: Form a stopping layer, an N-type ohmic contact layer 240, an N-type current spreading layer 251, an N-type cladding layer 252, an active layer 253, a P-type cladding layer 254, a P-type window layer 255 and a P-type ohmic contact layer 260 over the GaAs substrate in successive, wherein, the N-type current spreading layer 251, the N-type cladding layer 252, the active layer 253, the P-type cladding layer 254 and the P-type window layer 255 form a light-emitting epitaxial laminated layer 250.

II. Patterning the Ohmic Contact Layer and Fabricate the Expanding Electrode.

Figure 4:
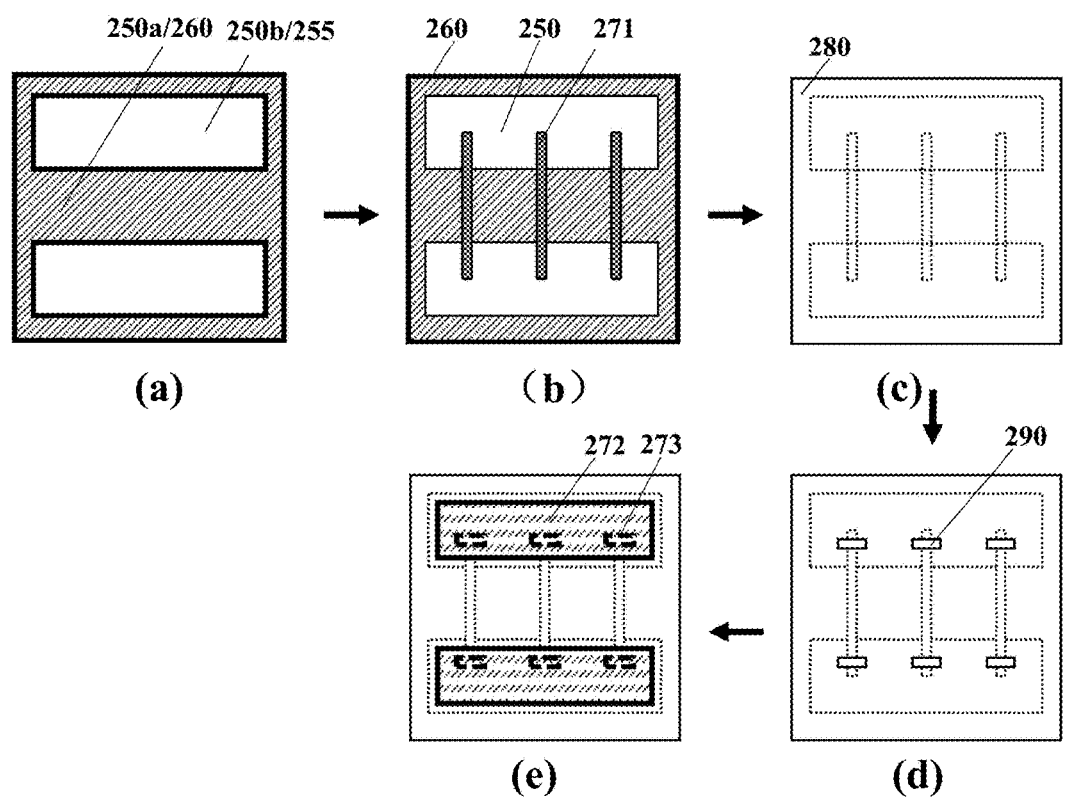
FIG. 4 illustrates a sectional view for the electrode fabrication process of the light-emitting diode chip according to some embodiments of the present disclosure.

Referring to FIG. 4, panel (a), define an ohmic contact region 250a and a non-ohmic contact region 250b over the surface of the light-emitting epitaxial laminated layer 250. In this embodiment, the chip appears rectangle. The non-ohmic contact region 250b is distributed at both ends of the upper surface of the light-emitting epitaxial laminated layer. Remove the ohmic contact layer of the non-ohmic contact region 250b to expose the P-type window layer 255 of the light-emitting epitaxial laminated layer.

Referring to FIG. 4, panel (b), fabricate an expanding electrode 271. This expanding electrode 271 is a series of parallel linear structure, in which, the first and last ends are in the non-ohmic contact region 250b, and the mid part contacts with the P-type ohmic contact layer 260.

III. Transfer the Substrate.

First, transfer the substrate for the first time. Specifically, provide a temporary substrate, and bind it to the P-side surface (In this embodiment, the P-side surface includes surfaces of the P-type ohmic contact layer 260, the expanding electrode 271 and the P-type window layer 255) of the light-emitting epitaxial laminated layer 250, and remove the growth substrate to expose the N-side surface of the light-emitting epitaxial laminated layer. In this embodiment, expose the N-type ohmic contact layer 251; and fabricate a reflector over the surface of the exposed light-emitting epitaxial laminated layer. In a preferred embodiment, etch a part of the N-type contact layer and remain some ohmic contact points 231. Deposit a transparent medium layer 230 and a conductive reflective layer 220 over the N-type ohmic contact layer, wherein, the transparent medium layer 230 can be a single-layer structure, or a distributed Bragg reflection layer structure with alternating-stacked materials with high and low refractive index; and the conductive reflective layer 220 can be metal materials with high refractive index, such as Ag and Al.

Next, transfer the substrate for the second time. Specifically, provide a conductive substrate 200, and coat a metal bonding layer 210 over the conductive substrate 200 and the reflective layer 220 respectively for high temperature bonding so that the light-emitting epitaxial laminated layer is bonded to the conductive substrate 200; remove the temporary substrate to expose the P-side surface of the light-emitting epitaxial laminated layer 250, thus finishing substrate transfer process.

IV. Fabricate the Transparent Insulating Layer and the Welding Wire Electrode.

Cover a transparent insulating layer over the P-side surface of the exposed light-emitting epitaxial laminated layer 250. Referring to FIG. 4, panel (c), deposit a transparent insulating layer 280, which covers entire upper surface of the sample, which comprises an expanding electrode 271, an exposed P-type ohmic contact layer and a P-type window layer. This transparent insulating layer 280 users high-transparency medium, wherein, n value is between that of air and the epitaxy, and thickness $T=\lambda/4n$, serving as an antireflection film in the light-emitting region.

Referring to FIG. 4, panel (d), fabricate a current through hole 290 over the transparent insulating layer, which corresponds to the expanding electrode 271 of the non-ohmic contact region, and is distal from the P-type ohmic contact layer 260 as much as possible.

Referring to FIG. 4, panel (e), fabricate a welding wire electrode 272 over the transparent insulating layer, the projection of which on the light-emitting epitaxial laminated layer is in the non-ohmic contact region 250b, which fills the current through hole 290 to form a current channel so that a connection is built to the expanding electrode 271 to form a chip. The welding wire electrode 272 uses high-reflectivity material, and prefers to be Ti/Pt/Au, Cr/Al/Ti/Pt/Au or Ti/Al/Pt/Au structure.

In the above light-emitting diode, the transparent insulating layer 280 at least has the purposes in below: I. The transparent insulating layer is above the expanding electrode 271 and below the welding wire electrode 272 to make current expands outwards. This reduces current waste of the active layer under the welding wire electrode and light absorption and blocking of the welding wire electrode; II. serve as an antireflection film of the light-emitting surface; III. form an ODR system together with the welding wire electrode and the P-type ohmic contact layer 255, which reflects light emitted to the lower part of the welding wire electrode; and IV. serve as a protection film to prevent external or process scraps from adhering to the side wall of the chip core, which may form an electric leakage path.

Figure 5:
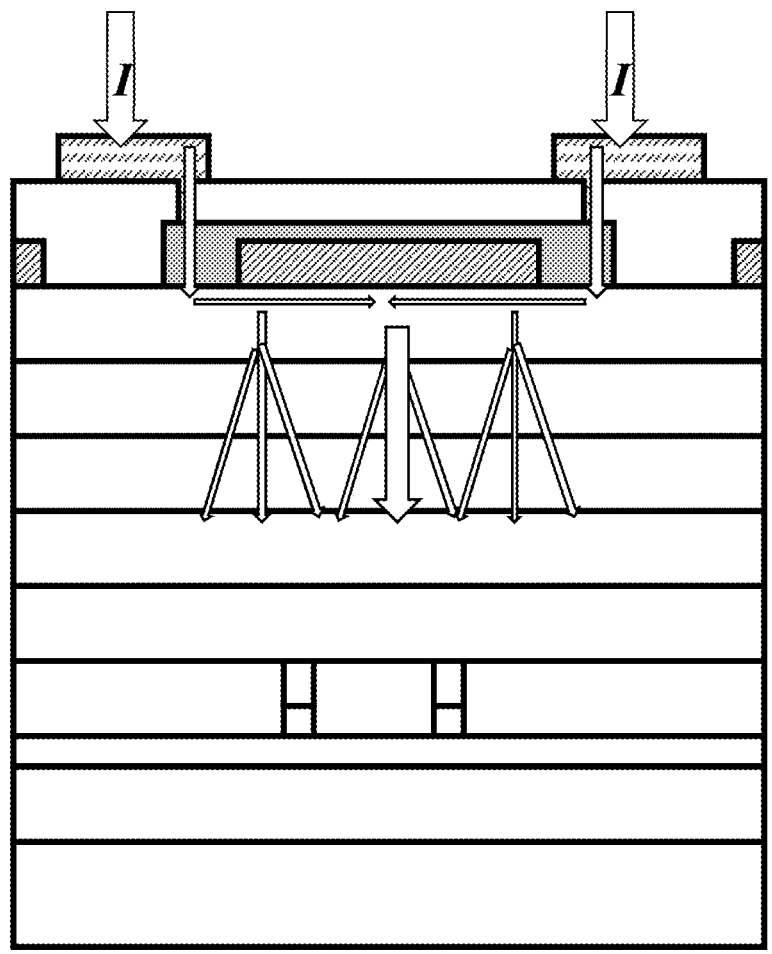
FIG. 5 shows a current flow diagram of the light-emitting diode as shown in FIG. 3.

FIG. 5 illustrates a current flow diagram of the above light-emitting diode. An insulating layer is provided below the welding wire electrode, which is far from the P-type ohmic contact layer, whose lower part and the regions near the expanding electrode have no ohmic contact. Therefore, current directly flows to the active region along the current channel to achieve effective outward expansion of current. When external power is connected, as current takes priority to flow along the path with lowest resistance, it quickly flows to the ohmic contact region in the active region along the current channel below the welding wire electrode.

Figure 6:
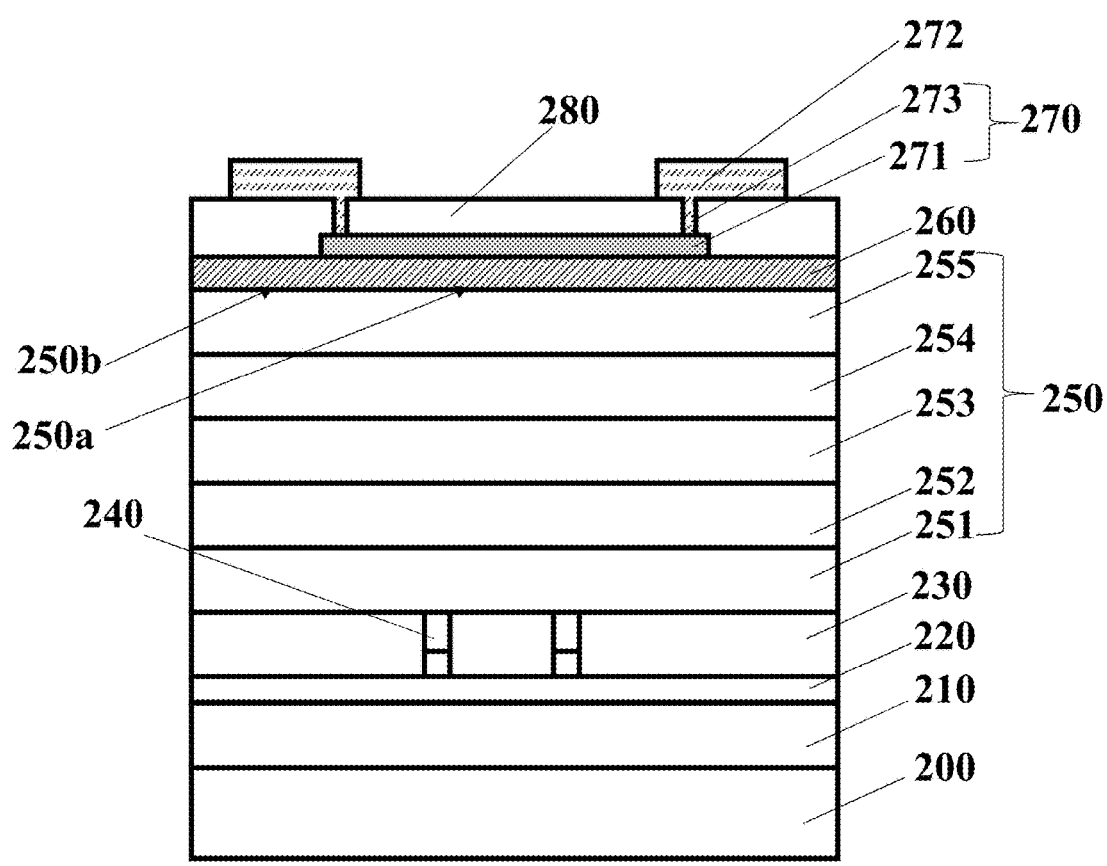
FIG. 6 illustrates a side sectional view of a light-emitting diode according to some embodiments of the present disclosure.

With reference to FIG. 6, a light-emitting diode according to some embodiments of the present disclosure includes: a conductive substrate 200, a metal bonding layer 210, a conductive reflective layer 220, a transparent dielectric layer 230, a light-emitting epitaxial laminated layer 250, an ohmic contact layer 260, an expanding electrode 271, a transparent insulating layer 280 and a welding wire electrode 272, wherein, the conductive substrate 200 can be Si substrate; the transparent dielectric layer 230 is provided with a series contact points 240; the transparent dielectric layer 230 and the conductive reflective layer 220 form an omnidirectional mirror system; the upper surface of the light-emitting epitaxial laminated layer 250 is divided into an ohmic contact region 250a and a non-ohmic contact region 250b; the ohmic contact layer 260 is formed over the upper surface of the light-emitting epitaxial laminated layer 250; and the expanding electrode 271 is formed over the ohmic contact layer 260, which is in a position corresponding to ohmic contact region 250a and extends towards the non-ohmic contact region 250b of the light-emitting epitaxial laminated layer, in some embodiments, the expanding electrode 271 is a series of parallel linear structure, in which, the first and last ends are in the non-ohmic contact region 250b, and the mid part is in the ohmic contact region 250a; the transparent insulating layer 280 covers the expanding electrode 271 and the exposed ohmic contact layer 260; a current channel 273 is in and runs through the transparent insulating layer 280, and connects to the expanding electrode 271, wherein, the projection on the light-emitting epitaxial laminated layer is in the non-ohmic contact region 250b; the welding wire electrode 272 is over the transparent insulating layer 280, which connects to the expanding electrode 271 via the current channel 273, the projection of which on the light-emitting epitaxial laminated layer is in the non-ohmic contact region 250b.

In the above light-emitting diode, first, the transparent insulating layer 280 is above the expanding electrode 271 and below the welding wire electrode 272 to make current expands outwards, which reduces current waste of the active layer under the welding wire electrode and light absorption and blocking of the welding wire electrode; second, the transparent insulating layer 280 can serve as an antireflection film of the light-emitting surface, which improve the light extraction efficiency; third, the transparent insulating layer 280 form an ODR system together with the welding wire electrode and the ohmic contact layer 260, which reflects light emitted to the lower part of the welding wire electrode; and fourth, the transparent insulating layer 280 can serve as a protection film to prevent external or process scraps from adhering to the side wall of the chip core, which may form an electric leakage path.

Figure 7:
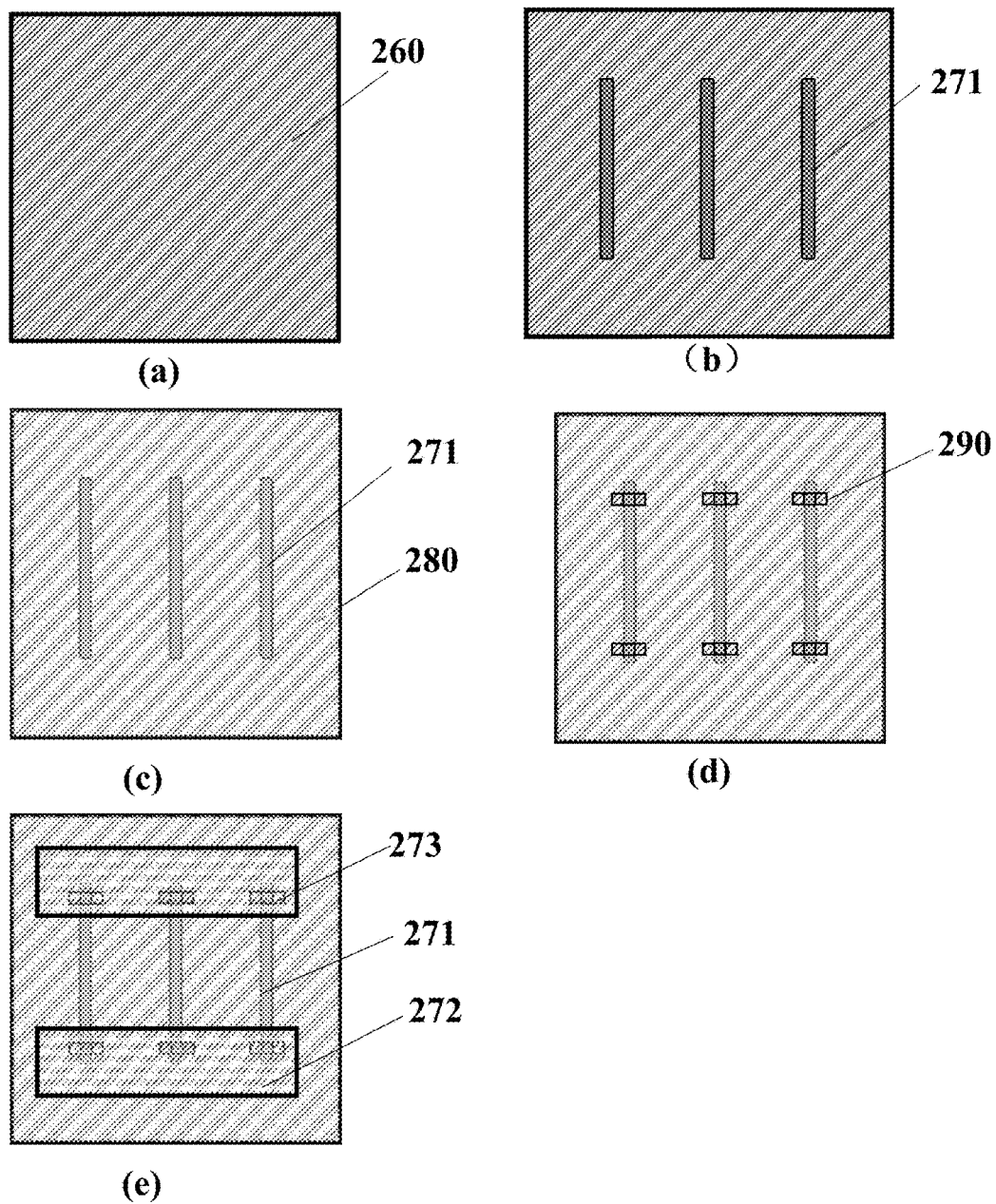
FIG. 7 illustrates an electrode fabrication process of the light-emitting diode chip according to some embodiments of the present disclosure.

FIG. 7 illustrates a sectional view for the electrode fabrication process of the light-emitting diode as shown in FIG. 6.

First, referring to FIG. 7, panel (a), forming the ohmic contact layer 260 over the upper surface of the light-emitting epitaxial laminated layer 250, in which, the material can be a semiconductor material or a transparent conductive material.

Next, referring to FIG. 7, panel (b), fabricate an expanding electrode 271. In some embodiments, the chip appears rectangle, the upper surface of the light-emitting epitaxial laminated layer 250 is divided into an ohmic contact region 250a and a non-ohmic contact region 250b, in which the non-ohmic contact region 250b is distributed at both ends of the upper surface of the light-emitting epitaxial laminated layer and the ohmic contact region 250a is distributed in between the both ends, the expanding electrode 271 is a series of parallel linear structure, in which, the first and last ends are in the non-ohmic contact region 250b, and the mid parts are in the ohmic contact region 250a.

Next, referring to FIG. 7, panel (c), deposit a transparent insulating layer 280, which covers entire upper surface of the sample, which comprises an expanding electrode 271, an exposed P-type ohmic contact layer 260. This transparent insulating layer 280 users high-transparency medium, wherein, n value is between that of air and the epitaxy, and thickness $T=\lambda/4n$, serving as an antireflection film in the light-emitting region.

Next, referring to FIG. 7, panel (d), fabricate a current through hole 290 over the transparent insulating layer, which corresponds to the expanding electrode 271 of the non-ohmic contact region 250b, and is distal from the expanding electrode 271 as much as possible.

Referring to FIG. 7, panel (e), fabricate a welding wire electrode 272 over the transparent insulating layer, the projection of which on the light-emitting epitaxial laminated layer is in the non-ohmic contact region 250b, which fills the current through hole 290 to form a current channel so that a connection is built to the expanding electrode 271 to form a chip. The welding wire electrode 272 uses high-reflectivity material, and prefers to be Ti/Pt/Au, Cr/Al/Ti/Pt/Au or Ti/Al/Pt/Au structure.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:
1. A light-emitting diode, comprising:
  a light-emitting epitaxial laminated layer including:
    a first semiconductor layer;
    an active layer; and
    a second semiconductor layer;
  an ohmic contact layer over an upper surface of the light-emitting epitaxial laminated layer;
  an expanding electrode over the ohmic contact layer;
  a transparent insulating layer that covers the expanding electrode and an exposed ohmic contact layer and having a hole through the transparent insulating layer in a position corresponding to the expanding electrode; and
  a welding wire electrode over the transparent insulating layer and coupled to the expanding electrode via the hole.
2. The light-emitting diode of claim 1, wherein:
  an upper surface of the light-emitting epitaxial laminated layer is divided into an ohmic contact region and a non-ohmic contact region' the expanding electrode is provided in the ohmic contact region and extends towards to the non-ohmic contact region; and the welding wire electrode is provided in non-ohmic contact region.

3. The light-emitting diode of claim 2, wherein the non-ohmic contact region over the upper surface of the light-emitting epitaxial laminated layer is larger than the welding wire electrode.

4. The light-emitting diode of claim 2, wherein the hole is distal from the ohmic contact region as much as possible.

5. The light-emitting diode of claim 2, wherein, the hole is provided in the non-ohmic contact region.

6. The light-emitting diode of claim 2, wherein, the non-ohmic contact region is distributed at both ends of the upper surface of the light-emitting epitaxial laminated layer; and the expanding electrode is a series of parallel linear structure, in which, the first and last ends are in the non-ohmic contact region, and the mid part contacts with the ohmic contact layer.

7. The light-emitting diode of claim 1, wherein, refractive index of the transparent insulating layer is between that of the light-emitting epitaxial laminated layer and air.

8. The light-emitting diode of claim 1, wherein, the transparent insulating layer, the light-emitting epitaxial laminated layer, and the welding wire electrode form an omnidirectional reflection system to avoid light absorption by the welding wire electrode.

9. The light-emitting diode of claim 1, wherein, the transparent insulating layer in the ohmic contact region is $\lambda/4n$ thick.

10. The light-emitting diode of claim 1, wherein, a lower surface of the light-emitting epitaxial laminated layer is provided with a reflector.

11. A light-emitting system including a plurality of light-emitting diodes according to claim 1.

12. The light-emitting system of claim 11, wherein:
an upper surface of the light-emitting epitaxial laminated layer is divided into an ohmic contact region and a non-ohmic contact region;
the expanding electrode is provided in the ohmic contact region and extends towards to the non-ohmic contact region; and
the welding wire electrode is provided in non-ohmic contact region.

13. The light-emitting system of claim 12, wherein the non-ohmic contact region over the upper surface of the light-emitting epitaxial laminated layer is larger than the welding wire electrode.

14. The light-emitting system of claim 11, wherein the hole is provided in the non-ohmic contact region.

15. A fabrication method of a light-emitting diode, the method comprising:
1) forming a light-emitting epitaxial laminated layer, wherein, the light-emitting epitaxial laminated layer comprises a first semiconductor layer, an active layer and a second semiconductor layer;
2) forming an ohmic contact layer over an upper surface of the light-emitting epitaxial laminated layer;
3) forming an expanding electrode over the ohmic contact layer;
4) forming a transparent insulating layer over the expanding electrode which covers the expanding electrode, the exposed ohmic contact layer, and having a hole through the transparent insulating layer in a position corresponding to the expanding electrode; and 5) forming a welding wire electrode over the transparent insulating layer, which connects to the expanding electrode via the hole.

16. A fabrication method of a light-emitting diode, the method comprising:
1) forming a light-emitting epitaxial laminated layer over a growth substrate, comprising a first semiconductor layer, an active layer and a second semiconductor layer having a first surface and a second surface opposite to each other, wherein, the first surface is distal from the growth substrate;
2) forming an ohmic contact layer over the first surface of the light-emitting epitaxial laminated layer;
3) fabricating an expanding electrode over the ohmic contact layer;
4) providing a temporary substrate, and binding it to the first surface of the light-emitting epitaxial laminated layer;
5) removing the growth substrate to expose the second surface of the light-emitting epitaxial laminated layer;
6) forming a reflector over the second surface of the light-emitting epitaxial laminated layer;
7) providing a conductive substrate, and binding it to the reflector;
8) removing the temporary substrate to expose the expanding electrode, a part surface of the ohmic contact layer;
9) forming a transparent insulating layer, which covers the expanding electrode and the exposed ohmic contact layer;
10) setting a hole though the transparent insulating layer in a position corresponding to the expanding electrode; and
11) forming a welding wire electrode over the transparent insulating layer, which connects to the expanding electrode via the hole.

wherein the fabricated light-emitting diode comprises:
the light-emitting epitaxial laminated layer, which comprises:
the first semiconductor layer;
the active layer; and
the second semiconductor layer;
the ohmic contact layer over an upper surface of the light-emitting epitaxial laminated layer;
the expanding electrode over the ohmic contact layer;
the transparent insulating layer that covers the expanding electrode and the exposed ohmic contact layer and having a hole through the transparent insulating layer in a position corresponding to the expanding electrode; and
the welding wire electrode over the transparent insulating layer, which connects to the expanding electrode via the hole.

17. The method of claim 16, wherein:
the first surface of the light-emitting epitaxial laminated layer is divided into an ohmic contact region and a non-ohmic contact region;
the expanding electrode is provided in the ohmic contact region and extends towards to the non-ohmic contact region; and
the welding wire electrode is provided in non-ohmic contact region.

18. The method of claim 17, wherein the non-ohmic contact region over the upper surface of the light-emitting epitaxial laminated layer is larger than the welding wire electrode.

19. The method of claim 17, wherein the hole is distal from the ohmic contact region as much as possible.

20. The method of claim 17, wherein:
the non-ohmic contact region is distributed at both ends of the upper surface of the light-emitting epitaxial laminated layer; and
the expanding electrode is a series of parallel linear structure, in which, the first and last ends are in the non-ohmic contact region, and the mid part contacts with the ohmic contact layer.

* * * * *